(12) United States Patent
Fukushima et al.

(10) Patent No.: US 10,266,924 B2
(45) Date of Patent: Apr. 23, 2019

(54) TANTALUM SPUTTERING TARGET

(75) Inventors: Atsushi Fukushima, Ibaraki (JP);
Kunihiro Oda, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 587 days.

(21) Appl. No.: 13/142,427

(22) PCT Filed: Apr. 23, 2010

(86) PCT No.: PCT/JP2010/057237
§ 371 (c)(1),
(2), (4) Date: Jun. 28, 2011

(87) PCT Pub. No.: WO2010/134417
PCT Pub. Date: Nov. 25, 2010

(65) Prior Publication Data
US 2011/0266145 A1    Nov. 3, 2011

(30) Foreign Application Priority Data
May 22, 2009    (JP) .................. 2009-124566

(51) Int. Cl.
C22C 27/00 (2006.01)
C22C 27/02 (2006.01)
C23C 14/34 (2006.01)

(52) U.S. Cl.
CPC .............. *C22C 27/00* (2013.01); *C22C 27/02* (2013.01); *C23C 14/3414* (2013.01)

(58) Field of Classification Search
CPC .......... C22C 27/00; C23C 14/14; C23C 14/34
USPC ...................... 148/668; 204/298.13; 420/427
See application file for complete search history.

(56) References Cited

U.S. PATENT DOCUMENTS

| | | | |
|---|---|---|---|
| 5,693,203 A | 12/1997 | Ohhashi et al. | |
| 6,331,233 B1 | 12/2001 | Turner | |
| 6,348,113 B1 | 2/2002 | Michaluk et al. | |
| 6,348,139 B1 | 2/2002 | Shah et al. | |
| 6,589,311 B1 | 7/2003 | Han et al. | |
| 6,676,728 B2 | 1/2004 | Han et al. | |
| 6,759,143 B2 | 7/2004 | Oda et al. | |
| 6,770,154 B2 | 8/2004 | Koenigsmann et al. | |
| 6,878,250 B1 * | 4/2005 | Segal et al. .............. | 204/298.13 |
| 6,887,356 B2 * | 5/2005 | Ford .................. | C23C 14/3407 204/298.12 |
| 6,893,513 B2 | 5/2005 | Michaluk et al. | |
| 7,156,963 B2 | 1/2007 | Oda | |
| 7,699,948 B2 | 4/2010 | Oda | |
| 7,716,806 B2 | 5/2010 | Oda | |
| 7,740,717 B2 | 6/2010 | Oda | |
| 7,892,367 B2 | 2/2011 | Oda | |
| 8,172,960 B2 | 5/2012 | Oda et al. | |
| 8,177,947 B2 | 5/2012 | Miyashita | |
| 8,425,696 B2 | 4/2013 | Oda et al. | |
| 9,085,819 B2 | 7/2015 | Senda et al. | |
| 2005/0155677 A1 | 7/2005 | Wickersham, Jr. | |
| 2005/0230244 A1 | 10/2005 | Inoue et al. | |
| 2007/0089815 A1 * | 4/2007 | Wickersham et al. ........ | 148/668 |
| 2007/0102288 A1 | 5/2007 | Oda et al. | |
| 2009/0032392 A1 | 2/2009 | Miyashita | |
| 2009/0134021 A1 | 5/2009 | Oda et al. | |
| 2012/0031756 A1 | 2/2012 | Fukushima et al. | |
| 2012/0037501 A1 | 2/2012 | Fukushima et al. | |
| 2013/0092534 A1 | 4/2013 | Senda et al. | |
| 2013/0098759 A1 | 4/2013 | Senda et al. | |
| 2014/0242401 A1 | 8/2014 | Senda et al. | |
| 2015/0064056 A1 | 3/2015 | Nagatsu et al. | |

FOREIGN PATENT DOCUMENTS

| | | |
|---|---|---|
| EP | 0902102 A1 | 3/1999 |
| JP | 2000-212678 A | 8/2000 |
| JP | 2002-060934 A | 2/2002 |
| JP | 2005-336617 A | 12/2005 |

OTHER PUBLICATIONS

Hashimoto et. al. "High Quality Ta2O5 Films Using Ultra-High Purity Ta Sputtering Target", Japanese Journal of Applied Physics, pp. 253-256, Aug. 20, 1986.

* cited by examiner

*Primary Examiner* — Jie Yang
(74) *Attorney, Agent, or Firm* — Howson & Howson LLP

(57) ABSTRACT

Provided is a tantalum sputtering target containing 1 mass ppm or more and 100 mass ppm or less of niobium as an essential component, and having a purity of 99.999% or more excluding niobium and gas components. Thereby obtained is a high purity tantalum sputtering target comprising a uniform and fine structure and which yields stable plasma and superior film evenness (uniformity).

4 Claims, No Drawings

TANTALUM SPUTTERING TARGET

BACKGROUND OF THE INVENTION

The present invention relates to a high purity tantalum sputtering target comprising a uniform and fine structure and which yields stable plasma and superior film evenness (uniformity).

In recent years, the sputtering method for forming a film from materials such as metal or ceramics has been used in numerous fields such as electronics, corrosion resistant materials and ornaments, catalysts, as well as in the manufacture of cutting/polishing materials and abrasion resistant materials.

Although the sputtering method itself is a well-known method in the foregoing fields, recently, particularly in the electronics field, a tantalum sputtering target suitable for forming films of complex shapes, forming circuits or forming barrier films is in demand.

Generally, this tantalum target is produced by repeating the hot forging and annealing (heat treatment) of an ingot or billet formed by performing electron beam melting and casting to a tantalum raw material, and thereafter performing rolling and finish processing (mechanical processing, polishing, etc.) thereto.

In this kind of production process, the hot forging performed to the ingot or billet will destroy the cast structure, disperse or eliminate the pores and segregations, and, by further annealing this, recrystallization will occur, and the densification and strength of the structure can be improved to a certain degree.

The molten and cast ingot or billet generally has a crystal grain size of 50 mm or more. As a result of subjecting the ingot or billet to hot forging and recrystallization annealing, the cast structure is destroyed, and generally uniform and fine (100 μm or less) crystal grains can be obtained.

Meanwhile, if sputtering is to be performed using a target produced as described above, it is said that the recrystallized structure of the target becomes even finer and more uniform, more uniform deposition is possible with a target in which the crystal orientation is aligned toward a specific direction, and a film with low generation of arcing and particles and stable characteristics can be obtained.

Thus, measures are being taken for achieving a finer and more uniform recrystallized structure and aligning the crystal orientation toward a specific direction in the production process of the target (for example, refer to Patent Document 1 and Patent Document 2).

Moreover, disclosed is a high purity Ta target for forming a TaN film to be used as a barrier layer in a Cu wiring film which is obtained by containing 0.001 to 20 ppm of an element selected among Ag, Au and Cu as an element having self-sustained discharge characteristics, causing the total amount of Fe, Ni, Cr, Si, Al, Na, and K as impurity elements to be 100 ppm or less, and using a high purity Ta in which the value obtained by subtracting such impurity elements is within the range of 99.99 to 99.999% (refer to Patent Document 3).

When reviewing these Patent Documents, there is no disclosure to the effect of the inclusion of a specific element realizing a finer structure and thereby stabilizing the plasma.

In particular, Patent Document 3 increases the discharge amount of Ta ions by adding an infinitesimal amount of an element up to 0.001 ppm as a result of containing an element selected among Ag, Au and Cu in an amount of 0.001 to 20 ppm. However, since the additive element is added in a trace amount, it is considered that there is a problem in that it is difficult to adjust the content and realize an uniform addition (variation).

In addition, as shown in Table 1 of Patent Document 3, the inclusion of amounts of Mo, W, Ge, and Co is respectively tolerated at less than 10 ppm, 20 ppm, 10 ppm, and 10 ppm. This alone adds up to impurities in an amount that is less than 50 ppm.

Accordingly, as described above, although Patent Document 3 describes "causing the total amount of Fe, Ni, Cr, Si, Al, Na, and K as impurity elements to be 100 ppm or less, and using a high purity Ta in which the value obtained by subtracting such impurity elements is within the range of 99.99 to 99.999%," the lower limit of the actual purity falls below (tolerates) 99.99%.

This is a level that is lower than conventional high purity tantalum, and it is strongly assumed that the characteristics of high purity tantalum cannot be utilized.

[Patent Document 1] Published Japanese translation of (WO) 2002-518593
[Patent Document 2] U.S. Pat. No. 6,331,233
[Patent Document 3] Japanese Published Unexamined Application No. 2002-60934

SUMMARY OF THE INVENTION

An object of the present invention is to provide a high purity tantalum sputtering target comprising a uniform and fine structure and which yields stable plasma and superior film evenness (uniformity) by maintaining the high purity of tantalum and adding a specific element.

In order to achieve the foregoing object, the present inventors discovered that it is possible to obtain a high purity tantalum sputtering target comprising a uniform and fine structure and which yields stable plasma and superior film evenness (uniformity) by maintaining the high purity of tantalum and adding a specific element.

Based on the foregoing discovery, the present invention provides:
1) A tantalum sputtering target containing 1 mass ppm or more and 100 mass ppm or less of niobium as an essential component, and having a purity of 99.998% or more excluding niobium and gas components;
2) A tantalum sputtering target containing 10 mass ppm or more and 100 mass ppm or less of niobium as an essential component, and having a purity of 99.999% or more excluding niobium and gas components;
3) A tantalum sputtering target containing 10 mass ppm or more and 50 mass ppm or less of niobium as an essential component, and having a purity of 99.999% or more excluding niobium and gas components;
4) The tantalum sputtering target according to any one of 1) to 3) above, wherein variation of the niobium content in the target is ±20% or less;
5) The tantalum sputtering target according to any one of 1) to 4) above, wherein an average crystal grain size is 100 μm or less; and
6) The tantalum sputtering target according to 5) above, wherein variation of the crystal grain size is ±20% or less.

The present invention yields a superior effect of being able to provide a high purity tantalum sputtering target comprising a uniform and fine structure and which yields stable plasma and superior film evenness (uniformity) by maintaining the high purity of tantalum and adding niobium as an essential component. Moreover, since the plasma stabilization during sputtering can also be realized during the initial stage of sputtering, the present invention additionally yields the effect of being able to shorten the burn-in time.

DETAILED DESCRIPTION OF THE INVENTION

High purity tantalum is used as the raw material of the tantalum (Ta) target used in the present invention. An example of this high purity tantalum is shown in Table 1 (refer to the Journal of Technical Disclosure 2005-502770 entitled "High Purity Tantalum and Sputtering Target made of High Purity Tantalum" edited by the Japan Institute of Invention and Innovation).

In Table 1, the total amount of impurities excluding gas components is less than 1 mass ppm; that is, 99.999 to 99.9999 mass %, and this kind of high purity tantalum can be used.

TABLE 1

| Analytical Value | |
|---|---|
| Element | Concentration [ppm wt] |
| Li | <0.001 |
| Be | <0.001 |
| B | <0.005 |
| F | <0.05 |
| Na | <0.005 |
| Mg | <0.005 |
| Al | <0.005 |
| Si | <0.001 |
| P | <0.005 |
| S | <0.005 |
| Cl | <0.01 |
| K | <0.01 |
| Ca | <0.01 |
| Sc | <0.001 |
| Ti | <0.001 |
| V | <0.001 |
| Cr | <0.001 |
| Mn | <0.001 |
| Fe | <0.005 |
| Co | <0.001 |
| Ni | <0.005 |
| Cu | <0.01-0.20 |
| Zn | <0.01 |
| Ga | <0.01 |
| Ge | <0.01 |
| As | <0.005 |
| Se | <0.01 |
| Br | <0.01 |
| Rb | <0.005 |
| Sr | <0.005 |
| Y | <0.001 |
| Zr | <0.01 |
| Nb | 0.1-0.46 |
| Mo | 0.05-0.20 |
| Ru | <0.01 |
| Rh | <0.005 |
| Pd | <0.005 |
| Ag | <0.005 |
| Cd | <0.01 |
| In | <0.005 |
| Sn | <0.05 |
| Sb | <0.01 |
| Te | <0.01 |
| I | <0.01 |
| Cs | <0.005 |
| Ba | <0.005 |
| La | <0.005 |
| Ce | <0.005 |
| Pr | <0.005 |
| Nd | <0.005 |
| Sm | <0.005 |

TABLE 1-continued

| Analytical Value | |
|---|---|
| Element | Concentration [ppm wt] |
| Eu | <0.005 |
| Gd | <0.005 |
| Tb | <0.005 |
| Dy | <0.005 |
| Ho | <0.005 |
| Er | <0.005 |
| Tm | <0.005 |
| Yb | <0.005 |
| Lu | <0.005 |
| Hf | <0.01 |
| Ta | Matrix |
| W | <0.05-0.27 |
| Re | <0.01 |
| Os | <0.005 |
| Ir | <0.01 |
| Pt | <0.05 |
| Au | <0.1 |
| Hg | <0.05 |
| Tl | <0.005 |
| Pb | <0.005 |
| Bi | <0.005 |
| Th | <0.0001 |
| U | <0.0001 |

The sputtering target of the present invention is produced with the following process under normal circumstances.

To exemplify a specific example, foremost, tantalum; for instance, high purity tantalum of 4N (99.99% or more) is used, and appropriate amount of niobium (Nb) is added to prepare a target raw material. The purity thereof is increased by melting and refining the target raw material via electron beam melting or the like, and this is case to prepare an ingot or a billet. Needless to say, the high purity tantalum of 99.999 to 99.9999 mass % shown in Table 1 may be used from the start.

Then, this ingot or billet is subject to a series of processing steps including annealing-forging, rolling, annealing (heat treatment), finish processing and the like.

For instance, the foregoing ingot is subject to—extend forging—(first) annealing at a temperature of 1373 K to 1673 K—(first) cold forging—(second) recrystallization annealing at a starting temperature of recrystallization to 1373 K—(second) cold forging—(third) recrystallization annealing at a starting temperature of recrystallization to 1373 K—(first) cold (hot) rolling—(fourth) recrystallization annealing at a starting temperature of recrystallization to 1373 K—(as needed, second) cold (hot) rolling—(as needed, fifth) recrystallization annealing at a starting temperature of recrystallization to 1373 K—finish processing to obtain a target material.

The forging or rolling performed to the ingot or billet will destroy the cast structure, disperse or eliminate the pores and segregations, and, by further annealing this, recrystallization will occur, and the densification and strength of the structure can be improved to a certain degree by repeating the foregoing cold forging or cold rolling and recrystallization annealing. The recrystallization annealing may only be performed once in the foregoing processing process, but the structural defects can be reduced to the maximum by repeating such recrystallization annealing twice. And, the cold (hot) rolling and recrystallization annealing at a starting temperature of recrystallization to 1373 K may be performed for one or more cycle. The final target shape is obtained by subsequent finish processing such as machining and polishing.

The tantalum target is produced based on the foregoing production process under normal circumstances, but this production method is merely an exemplification. Moreover, since the present invention is not an invention of the production process, the target can be produced based on other processes and this invention covers all of these targets.

A material having a purity level of 6N is often used to leverage the characteristics of the tantalum target, but there was always a problem in that the crystal grains of the target would easily become coarse.

The present inventors discovered that, in the production of this kind of 6N level target, the crystal grain size was locally fine at the portion where Nb of a content of approximately 0.5 mass ppm under normal circumstances had segregated at approximately 1 mass ppm by chance. Accordingly, as a result of obtaining the hint that the addition of Nb may be effective for achieving a finer tantalum target, the present inventors found the opportunity that led to this invention.

Specifically, what is important with the tantalum sputtering target of this invention is that 1 mass ppm or more and 100 mass ppm or less of niobium is contained as an essential component in tantalum having a purity of 99.998% or more excluding niobium and gas components. 1 mass ppm as the lower limit of niobium is a numerical value for exhibiting the foregoing effect, and 100 mass ppm as the upper limit of niobium is the upper limit for maintaining the effect of the present invention. If this upper limit is exceeded, segregation of niobium will occur, a part of niobium in which the recrystallization is incomplete will arise, and the burn-in time will consequently be prolonged. Thus, 100 mass ppm set as the upper limit of niobium.

The inclusion of tantalum forms a uniform and fine structure of the target, thereby stabilizes the plasma, and improves the evenness (uniformity) of the sputtered film. Moreover, since the plasma stabilization during sputtering can also be realized during the initial stage of sputtering, the burn-in time can be shortened.

In this case, the purity of tantalum needs to be high purity; 99.998% or more. Here, gas components with a small atomic radius such as oxygen, hydrogen, carbon, nitrogen and the like can be excluded. However, gas components are excluded from the purity of tantalum of the present invention; since it generally is both difficult to exclude gas components without employing a special method and to eliminate them during the refining in the process flow under normal circumstances.

As described above, niobium realizes the uniform and fine structure of tantalum, but the inclusion of other metal components, metallic non-metal components, oxides, nitrides, carbides and other ceramics is harmful, and cannot be tolerated. This is because these impurity elements are considered to inhibit the effect of niobium. In addition, these impurities are clearly different from niobium, and it is difficult to achieve a uniform crystal grain size of the tantalum target, and it does not contribute to the stabilization of the sputtering characteristics.

The tantalum sputtering target of the present invention contains, as a more preferable range, 10 mass ppm or more and 100 mass ppm or less of niobium as an essential component, and has a purity of 99.999% or more excluding niobium and gas components.

Moreover, the tantalum sputtering target contains 10 mass ppm or more and 50 mass ppm or less of niobium as an essential component, and has a purity of 99.999% or more excluding niobium and gas components.

With the tantalum sputtering target of the present invention, preferably, variation of the niobium content in the target is ±20% or less.

So as long as the inclusion of an appropriate amount of niobium yields the function (property) of forming the uniform and fine structure of the tantalum sputtering target, the uniform dispersion of niobium will contribute even more to the uniform and fine structure of the target.

Obviously, it is easy to achieve the above with a standard production process, but it is necessary to take note of causing the variation of the niobium content in the target to be ±20% or less, and to have a clear intent to achieve the same.

The variation of the niobium content in the target is measured; for example, in the case of a discoid target, by taking three points (center point, ½ point of the radius, and point in the outer periphery or its vicinity) on eight equal lines passing through the center of the disk, and analyzing the niobium content at a total of 17 points {16 points+center point (since the center point is common, it is counted as one point)}.

Subsequently, the variation is calculated at the respective points based on the formula of {(maximum value−minimum value)/(maximum value+minimum value)}×100.

With the tantalum sputtering target of the present invention, more preferably, the average crystal grain size is 100 μm or less. The crystal grain size can be refined by the addition of an appropriate amount of niobium and a normal production process, but it is necessary to take note of causing the average crystal grain size to be 100 μm or less, and to have a clear intent to achieve the same.

More preferably, the variation of the crystal grain size is ±20% or less.

The variation of the average crystal grain size in the niobium target is measured; for example, in the case of a discoid target, by taking three points (center point, ½ point of the radius, and point in the outer periphery or its vicinity) on eight equal lines passing through the center of the disk, and measuring the crystal grain size of niobium at a total of 17 points {16 points+center point (since the center point is common, it is counted as one point)}.

Subsequently, the variation of the crystal grain size is calculated at the respective points based on the formula of {(maximum value−minimum value)/(maximum value+minimum value)}×100.

This kind of target structure yields stable plasma and superior evenness (uniformity) of the film. Moreover, since the plasma stabilization during sputtering can also be realized during the initial stage of sputtering, the present invention additionally yields the effect of being able to shorten the burn-in time.

EXAMPLE

The present invention is now explained in detail with reference to the Examples. These Examples are merely illustrative, and the present invention shall in no way be limited thereby. In other words, the present invention covers the other modes and modifications included in the technical concept of this invention.

Example 1

A raw material obtained by adding niobium in an amount corresponding to 1 mass ppm to tantalum having a purity of 99.998% was subject to electron beam melting, and this was cast to prepare an ingot having a thickness of 200 mm and diameter of 200 mmφ. The crystal grain size in this case was approximately 55 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1480 K. As a result of repeating forging and heat treatment once again, a material having a thickness 120 mm and a diameter 130 mmφ, and a structure in which the average crystal grain size is 100 µm was obtained.

Subsequently, this was subject to cold rolling and recrystallization annealing at 1173 K, and finish processing so as to obtain a target material having a thickness of 10 mm and a diameter of 450 mmφ.

The average crystal grain size of the target was 100 µm, and the variation of the crystal grain size was ±20%. Moreover, the variation of the niobium content was ±20%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is small (2.6 to 3.2%) from the initial stage to the end stage of sputtering in this Example; the fluctuation of the film thickness distribution is small.

The electrical energy required up to the initial stabilization of sputtering was also measured and showed 100 kwh, and the time was shortened. As the results shown in Table 2, besides being able to shorten the burn-in time, the evenness (uniformity) of the film was favorable, and it was possible to improve the quality of the sputter deposition.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment once again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve the following average crystal grain size and variation of the crystal grain size. Although the average crystal grain size and variation will also change depending on the additive amount of niobium, the foregoing adjustment was possible in this Example.

The average crystal grain size of the target was 80 µm, and the variation of the crystal grain size was ±17%. Moreover, the variation of the niobium content was ±18%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (a) thereof.

As the results shown in Table 2, evidently, the fluctuation of the resistance distribution in the sheet is small (2.5 to 3.0%) from the initial stage to the end stage of sputtering in this Example; the fluctuation of the film thickness distribution is small.

The electrical energy required up to the initial stabilization of sputtering was also measured and showed 85 kwh, and the time was shortened. As the results shown in Table 2, besides being able to shorten the burn-in time, the evenness (uniformity) of the film was favorable, and it was possible to improve the quality of the sputter deposition.

TABLE 2

| | Nb | Average Crystal Grain Size | Variation in Crystal Grain Size | Variation in Nb Content | Resistance Distribution in Sheet | Electrical Energy up to Initial Stability | Uniformity of Film |
|---|---|---|---|---|---|---|---|
| Example 1 | 1 | 100 | ±20% | ±20% | 2.6 to 3.2% | 100 kwh | Favorable |
| Example 2 | 5 | 80 | ±17% | ±18% | 2.5 to 3.0% | 85 kwh | Favorable |
| Example 3 | 10 | 70 | ±15% | ±16% | 2.3 to 2.7% | 75 kwh | Favorable |
| Example 4 | 20 | 60 | ±10% | ±12% | 2.0 to 2.2% | 72 kwh | Favorable |
| Example 5 | 50 | 50 | ±8% | ±10% | 1.7 to 1.9% | 50 kwh | Favorable |
| Example 6 | 70 | 45 | ±7% | ±8% | 1.3 to 1.5% | 45 kwh | Favorable |
| Example 7 | 100 | 40 | ±5% | ±6% | 1.0 to 1.2% | 35 kwh | Favorable |
| Comparative Example 1 | 0.5 | 120 | ±35% | ±40% | 3.8 to 6.0% | 150 kwh | Inferior |
| Comparative Example 2 | 150 | 200 Unrecrystallized | ±50% | ±70% | 4.5 to 7.0% | 300 kwh | Inferior |

Example 2

A raw material obtained by adding niobium in an amount corresponding to 5 mass ppm to tantalum having a purity of 99.999% was subject to electron beam melting, and this was cast to prepare an ingot having a thickness of 200 mm and diameter of 200 mmφ. The crystal grain size in this case was approximately 50 mm.

besides being able to shorten the burn-in time, the evenness (uniformity) of the film was favorable, and it was possible to improve the quality of the sputter deposition.

Example 3

A raw material obtained by adding niobium in an amount corresponding to 10 mass ppm to tantalum having a purity of 99.999% was subject to electron beam melting, and this was cast to prepare an ingot having a thickness of 200 mm and diameter of 200 mmφ. The crystal grain size in this case was approximately 45 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment once again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve the following average crystal grain size and variation of the crystal grain size. Although the average crystal grain size and variation will also change depending on the additive amount of niobium, the foregoing adjustment was possible in this Example.

The average crystal grain size of the target was 70 µm, and the variation of the crystal grain size was ±15%. Moreover, the variation of the niobium content was ±16%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is small (2.3 to 2.7%) from the initial stage to the end stage of sputtering in this Example; the fluctuation of the film thickness distribution is small.

The electrical energy required up to the initial stabilization of sputtering was also measured and showed 75 kwh, and the time was shortened. As the results shown in Table 2, besides being able to shorten the burn-in time, the evenness (uniformity) of the film was favorable, and it was possible to improve the quality of the sputter deposition.

Example 4

A raw material obtained by adding niobium in an amount corresponding to 20 mass ppm to tantalum having a purity of 99.999% was subject to electron beam melting, and this was cast to prepare an ingot having a thickness of 200 mm and diameter of 200 mmφ. The crystal grain size in this case was approximately 40 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment once again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve the following average crystal grain size and variation of the crystal grain size. Although the average crystal grain size and variation will also change depending on the additive amount of niobium, the foregoing adjustment was possible in this Example.

The average crystal grain size of the target was 60 µm, and the variation of the crystal grain size was ±10%. Moreover, the variation of the niobium content was ±12%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is small (2.0 to 2.2%) from the initial stage to the end stage of sputtering in this Example; the fluctuation of the film thickness distribution is small.

The electrical energy required up to the initial stabilization of sputtering was also measured and showed 72 kwh, and the time was shortened. As the results shown in Table 2, besides being able to shorten the burn-in time, the evenness (uniformity) of the film was favorable, and it was possible to improve the quality of the sputter deposition.

Example 5

A raw material obtained by adding niobium in an amount corresponding to 50 mass ppm to tantalum having a purity of 99.999% was subject to electron beam melting, and this was cast to prepare an ingot having a thickness of 200 mm and diameter of 200 mmφ. The crystal grain size in this case was approximately 35 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment once again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve the following average crystal grain size and variation of the crystal grain size. Although the average crystal grain size and variation will also change depending on the additive amount of niobium, the foregoing adjustment was possible in this Example.

The average crystal grain size of the target was 50 μm, and the variation of the crystal grain size was ±8%. Moreover, the variation of the niobium content was ±10%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is small (1.7 to 1.9%) from the initial stage to the end stage of sputtering in this Example; the fluctuation of the film thickness distribution is small.

The electrical energy required up to the initial stabilization of sputtering was also measured and showed 50 kwh, and the time was shortened. As the results shown in Table 2, besides being able to shorten the burn-in time, the evenness (uniformity) of the film was favorable, and it was possible to improve the quality of the sputter deposition.

Example 6

A raw material obtained by adding niobium in an amount corresponding to 70 mass ppm to tantalum having a purity of 99.999% was subject to electron beam melting, and this was cast to prepare an ingot having a thickness of 200 mm and diameter of 200 mmφ. The crystal grain size in this case was approximately 30 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment once again, a material having a thickness 120 mm and a diameter 130 mmφ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve the following average crystal grain size and variation of the crystal grain size. Although the average crystal grain size and variation will also change depending on the additive amount of niobium, the foregoing adjustment was possible in this Example.

The average crystal grain size of the target was 45 μm, and the variation of the crystal grain size was ±7%. Moreover, the variation of the niobium content was ±8%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (a) thereof.

As the results shown in Table 2, evidently from Table 2, the fluctuation of the resistance distribution in the sheet is small (1.3 to 1.5%) from the initial stage to the end stage of sputtering in this Example; that is, the fluctuation of the film thickness distribution is small.

The electrical energy required up to the initial stabilization of sputtering was also measured and showed 45 kwh, and the time was shortened. As the results shown in Table 2, besides being able to shorten the burn-in time, the evenness (uniformity) of the film was favorable, and it was possible to improve the quality of the sputter deposition.

Example 7

A raw material obtained by adding niobium in an amount corresponding to 100 mass ppm to tantalum having a purity of 99.999% was subject to electron beam melting, and this was cast to prepare an ingot having a thickness of 200 mm and diameter of 200 mmφ. The crystal grain size in this case was approximately 25 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment once again, a material having a thickness 120 mm and a diameter 130 mmφ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve the following average crystal grain size and variation of the crystal grain size. Although the average crystal grain size and variation will also change depending on the additive amount of niobium, the foregoing adjustment was possible in this Example.

The average crystal grain size of the target was 40 μm, and the variation of the crystal grain size was ±5%. Moreover, the variation of the niobium content was ±6%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is small (1.0 to 1.2%) from the initial stage to the end stage of sputtering in this Example; the fluctuation of the film thickness distribution is small.

The electrical energy required up to the initial stabilization of sputtering was also measured and showed 35 kwh, and the time was shortened. As the results shown in Table 2, besides being able to shorten the burn-in time, the evenness (uniformity) of the film was favorable, and it was possible to improve the quality of the sputter deposition.

Comparative Example 1

A raw material obtained by adding niobium in an amount corresponding to 0.5 mass ppm to tantalum having a purity of 99.995% was subject to electron beam melting, and this was cast to prepare an ingot having a thickness of 200 mm and diameter of 200 mmφ. The crystal grain size in this case was approximately 60 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment once again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve an appropriate average crystal grain size and variation of the crystal grain size, but the foregoing adjustment was not possible in this Comparative Example, and the average crystal grain size of the target was 120 µm, and variation of the crystal grain size was ±35%. In addition, variation of the niobium content was ±40%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is large (3.8 to 6.0%) from the initial stage to the end stage of sputtering in this Example; the fluctuation of the film thickness distribution is large.

The electrical energy required up to the initial stabilization of sputtering was also measured and showed 150 kwh, and the time increased. As the results shown in Table 2, it was not possible to shorten the burn-in time, the evenness (uniformity) of the film was inferior, and it was not possible to improve the quality of the sputter deposition.

Similar testing was performed for a case of adding niobium in an amount corresponding to 0.5 mass ppm to tantalum having a purity of 99.999%, but the same tendency as this Comparative Example 1 was observed. It was obvious that this also affected the purity of tantalum.

Comparative Example 2

A raw material obtained by adding niobium in an amount corresponding to 150 mass ppm to tantalum having a purity of 99.999% was subject to electron beam melting, and this was cast to prepare an ingot having a thickness of 200 mm and diameter of 200 mmφ. The crystal grain size in this case was approximately 20 mm.

Subsequently, after performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystalliza-tion annealing was performed thereto again at a temperature of 1400 to 1500 K. As a result of repeating forging and heat treatment once again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. The halfway and last cold working and recrystallization annealing were adjusted to achieve an appropriate average crystal grain size and variation of the crystal grain size, but the foregoing adjustment was not possible in this Comparative Example, and the average crystal grain size of the target was 200 µm and there was a part in which the recrystallization was incomplete (unrecrystallized), and variation of the crystal grain size was ±50%. And, variation of the niobium content was ±70%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is large (4.5 to 7.0%) from the initial stage to the end stage of sputtering in this Example; the fluctuation of the film thickness distribution is large.

The electrical energy required up to the initial stabilization of sputtering was also measured and showed 300 kwh, and the time increased. As the results shown in Table 2, it was not possible to shorten the burn-in time, the evenness (uniformity) of the film was inferior, and it was not possible to improve the quality of the sputter deposition.

When the additive amount of niobium added to tantalum having a purity of 99.999% exceeded 100 mass ppm, the crystal grain size coarsened and the variation increased rapidly, and variation of the niobium content also become prominent.

This is considered to be a result of the segregation of niobium, and it was discovered that the addition of excessive niobium is undesirable.

The present invention yields a superior effect of being able to provide a high purity tantalum sputtering target comprising a uniform and fine structure and which yields stable plasma and superior film evenness (uniformity) by containing 1 mass ppm or more and 100 mass ppm or less of niobium as an essential component, and having a purity of 99.998% or more excluding niobium and gas components. Moreover, since the plasma stabilization during sputtering can also be realized during the initial stage of sputtering, the present invention additionally yields the effect of being able to shorten the burn-in time. Thus, the target of the present invention is useful in the electronics field, particularly as a target suitable for forming films of complex shapes, forming circuits or forming barrier films.

The invention claimed is:
1. A tantalum sputtering target containing 50 mass ppm or more and 100 mass ppm or less of niobium as an essential component, having a purity of 99.999 mass % or more excluding niobium and gas components, having an average crystal grain size of 100 µm or less, having a variation of niobium content in the target of ±20% or less, and having a variation of average crystal grain size of ±20% or less.

2. The tantalum sputtering target according to claim 1, wherein the variation of the niobium content in the target is +6% to ±10%.

3. The tantalum sputtering target according to claim 1, wherein the average crystal grain size of the target is 40 to 50 μm.

4. The tantalum sputtering target according to claim 3, wherein the variation of the average crystal grain size is +5% to ±8%.

* * * * *